United States Patent
Kim et al.

(10) Patent No.: US 8,503,231 B2
(45) Date of Patent: Aug. 6, 2013

(54) MULTI-LEVEL CELL FLASH MEMORY DEVICE AND READ METHOD

(75) Inventors: Moo-sung Kim, Yongin-si (KR); Pan-suk Kwak, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 377 days.

(21) Appl. No.: 12/623,509

(22) Filed: Nov. 23, 2009

(65) Prior Publication Data

US 2010/0149869 A1 Jun. 17, 2010

(30) Foreign Application Priority Data

Dec. 17, 2008 (KR) .................. 10-2008-0128615

(51) Int. Cl.
*G11C 11/34* (2006.01)
(52) U.S. Cl.
USPC ................................................ 365/185.03
(58) Field of Classification Search
USPC ................................................ 365/185.03
See application file for complete search history.

(56) References Cited

U.S. PATENT DOCUMENTS

| 2007/0171711 | A1* | 7/2007 | Kang et al. | 365/185.03 |
| 2008/0080260 | A1* | 4/2008 | Seong | 365/189.05 |
| 2009/0225593 | A1* | 9/2009 | Cha et al. | 365/185.03 |
| 2010/0124107 | A1* | 5/2010 | Yoon | 365/185.2 |

FOREIGN PATENT DOCUMENTS

| JP | 2004192789 A | 7/2004 |
| JP | 2007157234 A | 6/2007 |
| KR | 100782329 B1 | 11/2007 |

* cited by examiner

*Primary Examiner* — Hoai V Ho
*Assistant Examiner* — Min Huang
(74) *Attorney, Agent, or Firm* — Volentine & Whitt, PLLC

(57) ABSTRACT

A method of reading data of a multi-level cell (MLC) flash memory device is disclosed. The method includes reading a least significant bit (LSB) and a most significant bit (MSB) of the data programmed to a plurality of memory cells. Reading each of the LSB and MSB includes; reading a MSB flag indicating whether or not the MSB for memory cells in a page of memory cells has been programmed, performing a first read with respect to a plurality of first bit lines, setting a target voltage in view of the read value of the MSB flag, applying the target voltage to a plurality of second bit lines, and performing a second read with respect to the plurality of second bit lines.

15 Claims, 9 Drawing Sheets

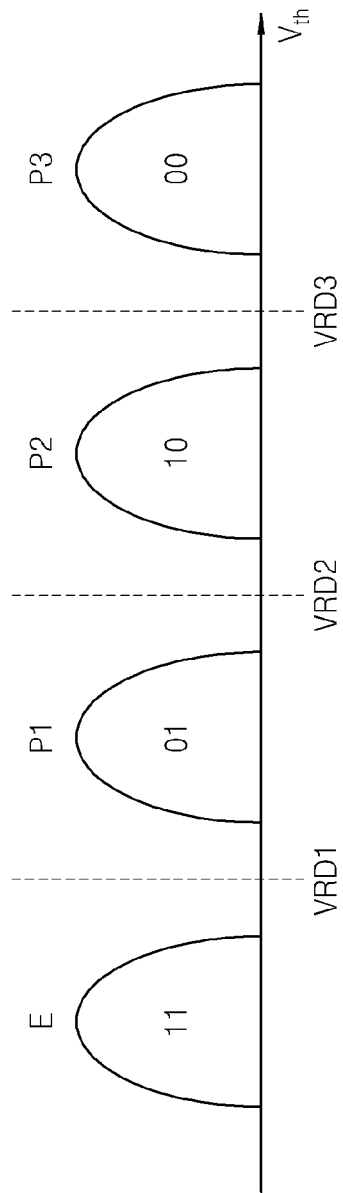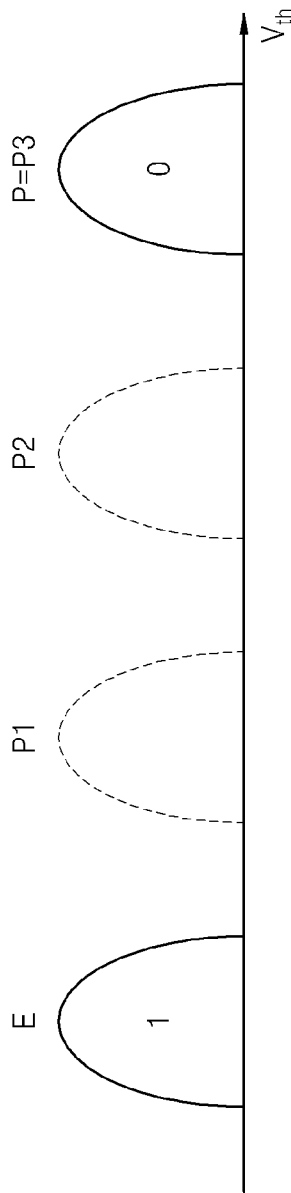

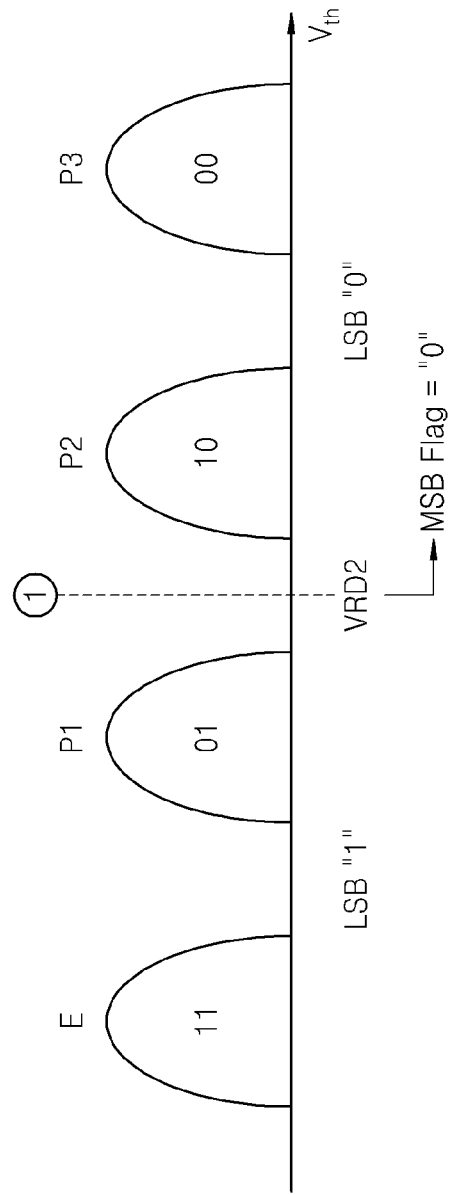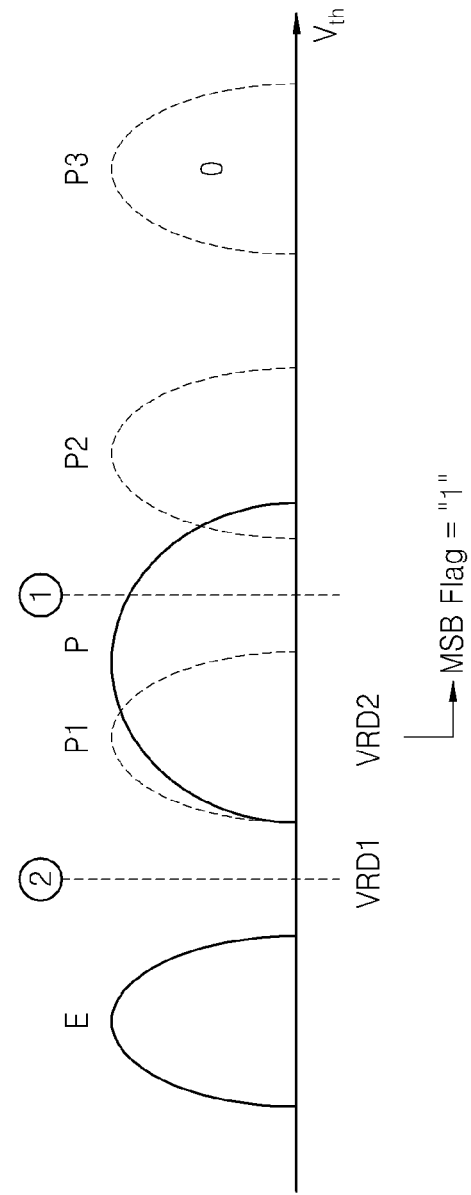

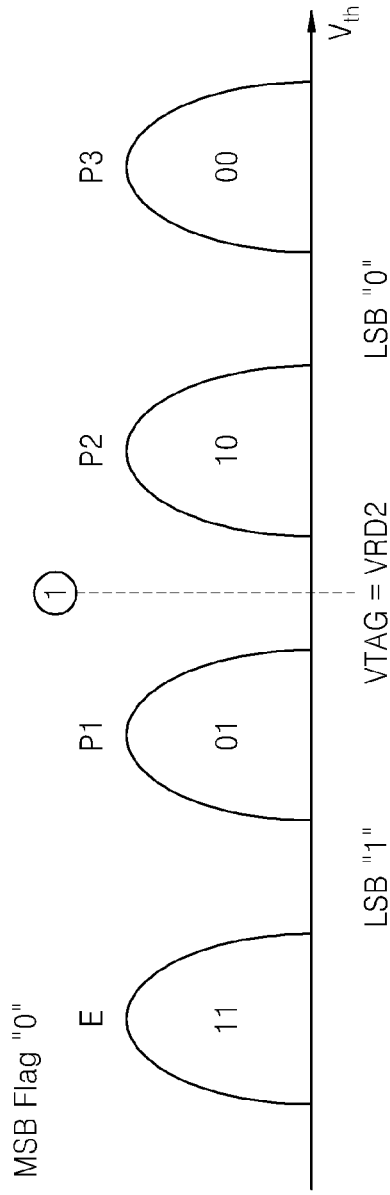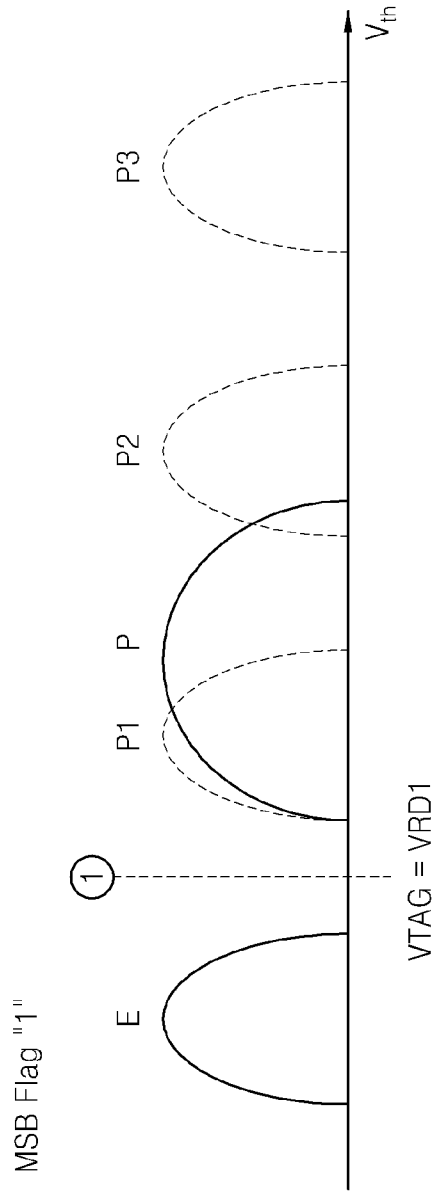
FIG. 6A
FIG. 6B

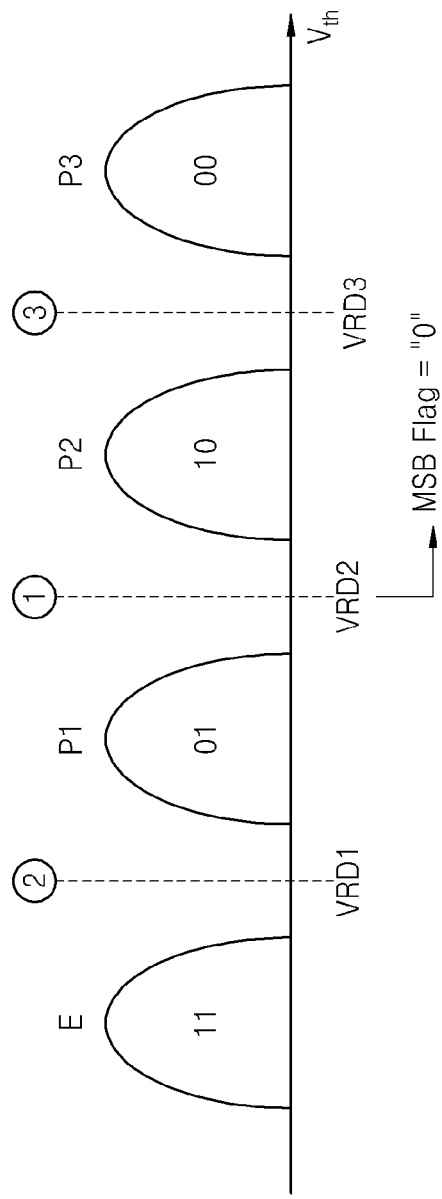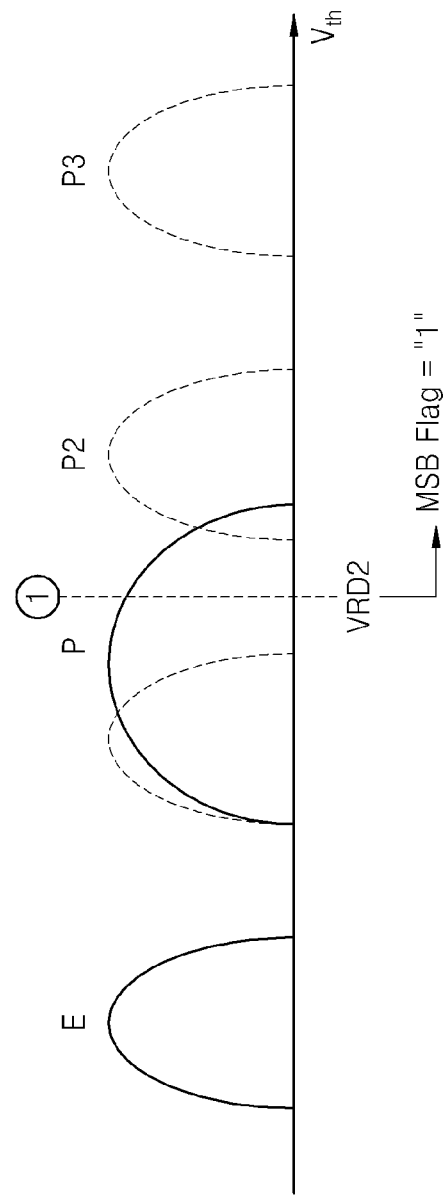

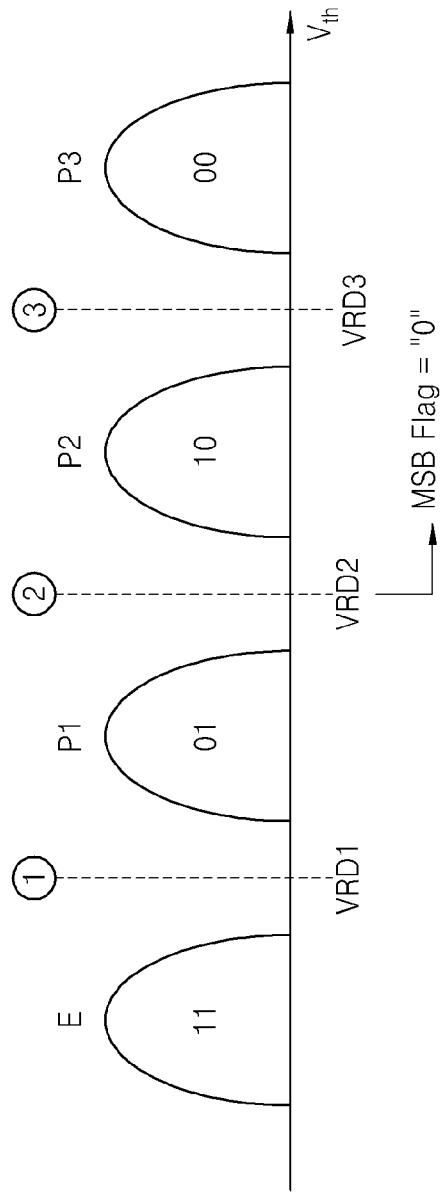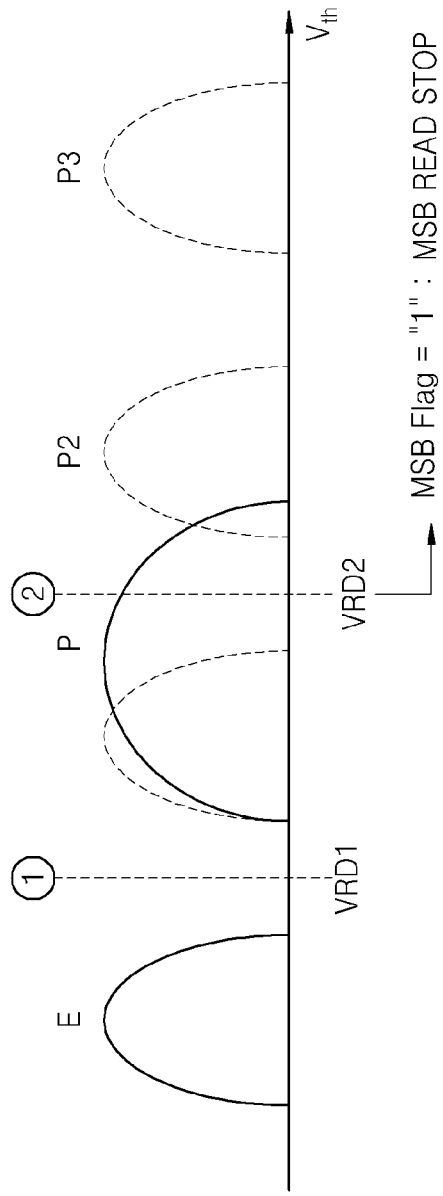

MULTI-LEVEL CELL FLASH MEMORY DEVICE AND READ METHOD

CROSS-REFERENCE TO RELATED APPLICATION

This U.S. non-provisional patent application claims priority under 35 U.S.C. §119 to Korean Patent Application No. 10-2008-0128615 filed on Dec. 17, 2008, the subject matter of which is hereby incorporated by reference.

BACKGROUND

The inventive concept relates to a semiconductor memory device and a related read method. More particularly, the inventive concept relates to a multi-level cell (MLC) flash memory device and read method providing reduced read time.

Flash memory is a form of non-volatile memory capable of retaining stored data in the absence of applied power. Flash memory is widely used in portable electronic devices, such as cellular phones, personal digital assistants (PDA), digital cameras, portable game consoles, MPEG-1 Audio Layer 3 (MP3) players, and the like, to store not only payload data, but also programming code. Flash memory is also widely used in various consumer electronics, such as high definition televisions (HDTV), Digital Versatile Discs (DVD), routers, Global Positioning Systems (GPS), etc.

Flash memory may be categorized according to the type of memory cells used to implement the constituent memory cell array. Either single-level cell (SLC) storing one data bit per memory cell, or MLC storing at least two data bits per memory cell may be used. The general expansion in the data storage capacity of flash memory as well as the increasing use of MLC has given rise to concern over the length of time required to access ("read") stored data. Indeed, "read time" has become an increasingly important memory system performance characteristic as flash memory is used to store different type of data. Thus, ongoing research is directed to not only ensuring data reliability in flash memory, but also reducing the time required to program data to and read data from MLC flash memory.

SUMMARY

According to one embodiment of the inventive concept, there is provided a method of reading data of a multi-level cell (MLC) flash memory device, the method including the operations of reading a least significant bit (LSB) of data programmed in a plurality of memory cells of the MLC flash memory device; and reading a most significant bit (MSB) of the data programmed in the plurality of memory cells of the MLC flash memory device.

The operations of reading the LSB and reading the MSB may include the operations of reading an MSB flag for indicating whether an MSB of data is programmed in a plurality of memory cells included in a page of the MLC flash memory device, and performing a first read with respect to a plurality of first bit lines of the MLC flash memory device; and setting a target voltage by using the MSB flag, applying the target voltage to a plurality of second bit lines of the MLC flash memory device, and performing a second read with respect to the plurality of second bit lines.

The first read and the second read may be simultaneously performed.

The operation of performing the first read may include the operation of storing the read MSB flag in a flag storing unit that is separated from a memory cell array.

When the MLC flash memory device is an N (N is an integer greater than 2)-bit MLC flash memory device, the operation of performing the first read may include the operation of reading the MSB flag by using a read voltage from among N−1 read voltages having different levels for reading N bits of the N-bit MLC flash memory device, and the operation of performing the second read may include the operation of setting at least one read voltage as the target voltage, wherein the read voltage is from among the N−1 read voltages having different levels for reading the N bits.

When the MSB flag indicates that the MSB of the data is not programmed in the plurality of memory cells included in the page corresponding to the MSB flag, the operation of reading the MSB may be ended as when the reading of the MSB flag is performed.

When the MLC flash memory device is a 2-bit MLC flash memory device and when four cell distributions for the plurality of memory cells are referred to as a first distribution, a second distribution, a third distribution and a fourth distribution according to voltages of the four cell distributions, data values indicated by the first distribution through the fourth distribution may be respectively "11", "01", "10" and "00", and when a first value of the MSB flag indicates that an MSB program is not performed on a page corresponding to the first value and when a second value of the MSB flag indicates that the MSB program is performed on a page corresponding to the second value, the first value and the second value may respectively have a distribution corresponding to the first distribution and a distribution corresponding to the fourth distribution.

The MSB flag may be read by a read voltage having a voltage level between the second distribution and the third distribution. The operation of performing the first read for reading the LSB may include the operation of reading the LSB of the plurality of corresponding memory cells by using a read voltage having a voltage between the first distribution and the second distribution when the MSB flag has the first value; and may include the operation of reading the LSB of the plurality of corresponding memory cells at the same time as when the MSB flag is read when the MSB flag has the second value.

The operation of performing the second read for reading the LSB may include the operation of reading the LSB of the plurality of corresponding memory cells by using a read voltage as the target voltage when the MSB flag has the first value, wherein the read voltage has a voltage between the first distribution and the second distribution; and may include the operation of reading the LSB of the plurality of corresponding memory cells by using a read voltage as the target voltage when the MSB flag has the second value, wherein the read voltage has a voltage between the second distribution and the third distribution.

According to another embodiment of the inventive concept, there is provided a memory system device comprising; a multi-level cell (MLC) flash memory device, and a memory controller configured to read data from the MLC flash memory device, wherein the MLC flash memory comprises a memory cell array implemented with a plurality of N-bit memory cells, where N is a positive integer, and a controller, wherein the controller is configured to read both a least significant bit (LSB) and a most significant bit (MSB) of the data programmed to a plurality of N-bit memory cells, such that reading each of the LSB and MSB comprises: reading a MSB flag indicating whether or not the MSB for memory cells in a page of the memory cells has been programmed, and then performing a first read with respect to a plurality of first bit lines, setting a target voltage in view of the read value of the MSB flag, applying the target voltage to a plurality of second bit lines, and performing a second read with respect to the plurality of second bit lines.

BRIEF DESCRIPTION OF THE DRAWINGS

Embodiments of the inventive concept will be more clearly understood from the following detailed description taken in conjunction with the accompanying drawings in which:

FIG. 3 illustrates memory cell threshold voltage distributions ("cell distributions") for a two-bit multi-level cell (MLC) flash memory device;

FIG. 4 illustrates cell distributions for a most significant bit (MSB) flag;

FIG. 5, inclusive of FIGS. 5A and 5B, is a diagram describing a first read with respect to a least significant bit (LSB), as performed in the flash memory device of FIG. 1;

FIG. 6, inclusive of FIGS. 6A and 6B, is a diagram describing a second read performed following the first read with respect to the LSB of FIG. 5;

FIG. 7, inclusive of FIGS. 7A and 7B, is a diagram describing a first read with respect to a MSB, as performed in the flash memory device of FIG. 1;

FIG. 8, inclusive of FIGS. 8A and 8B, is a diagram describing another first read with respect to a MSB, as performed in the flash memory device of FIG. 1;

DESCRIPTION OF EMBODIMENTS

The attached drawings illustrate exemplary embodiments of the inventive concept and may be referred to in order to gain a better understanding of the inventive concept, the merits thereof, and the objectives accomplished by the implementation of the inventive concept. Hereinafter, the inventive concept will be described in some additional detail with reference to the attached drawings. Throughout the written description and drawings, like reference number and label are used to denote like or similar elements.

Figure 1:
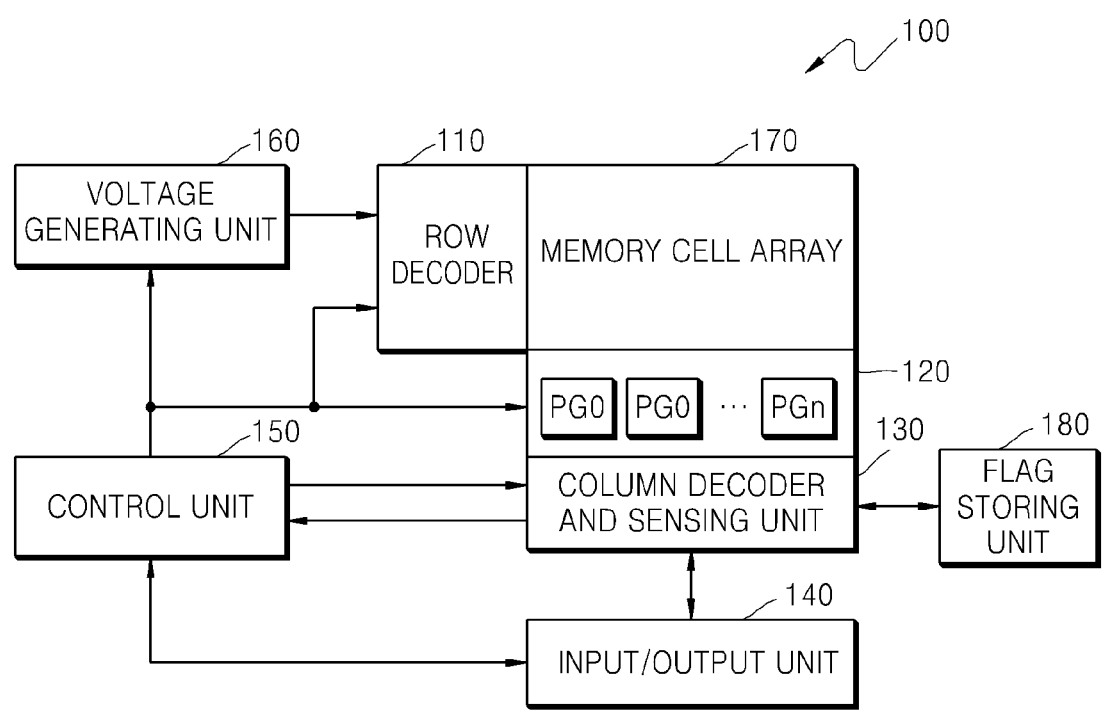
FIG. 1 is a block diagram of a flash memory device according to an embodiment of the inventive concept.
Figure 2:
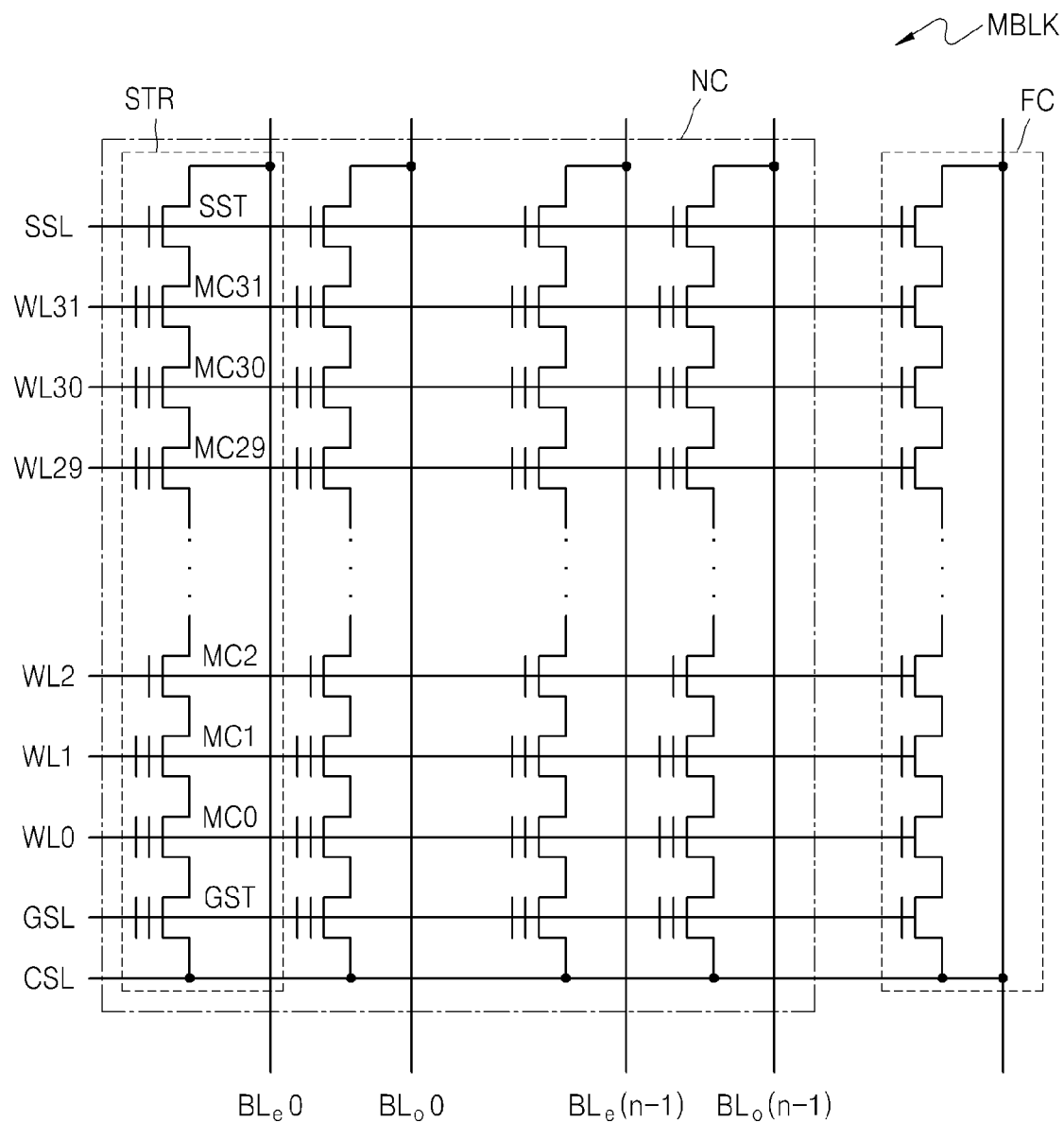
FIG. 2 is a partial diagram of a memory cell array in the flash memory device of FIG. 1.

FIG. 1 is a block diagram of a flash memory device 100 according to an embodiment of the inventive concept. FIG. 2 is a diagram further illustrating a memory cell array 170 in the flash memory device 100 of FIG. 1.

Referring collectively to FIGS. 1 and 2, the flash memory device 100 comprises the memory cell array 170 which is used to store data. The memory cell array 170 of FIG. 1 may be operationally divided into a plurality of memory blocks MBLK, as illustrated in FIG. 2.

In the illustrated embodiment, the flash memory device 100 is assumed to be a NAND flash memory device, although other types of non-volatile memory cells may be used in embodiments of the inventive concept. Thus, as illustrated in FIG. 2, the memory blocks MBLK of FIG. 1 have a string structure (STR) in which a plurality of memory cells are serially connected to a bit line.

To be more specific, each string STR of each memory block MBLK may include a string select transistor SST, a ground select transistor GST, and a plurality of memory cells MC0 through MC31. ON/OFF states of the string select transistor SST may be controlled by a string select line SSL and may be connected to a bit line corresponding to a drain of the string select transistor SST. ON/OFF states of the ground select transistor GST may be controlled by a ground select line GSL, and a source of the ground select transistor GST may be connected to a common source line CSL. Each of the memory cells MC0 through MC31 may be embodied as a floating gate transistor.

The memory cells MC0 through MC31 are serially connected between a source of the string select transistor SST and a drain of the ground select transistor GST, and ON/OFF states of the memory cells MC0 through MC31 may be controlled by word lines WL0 through WL31 respectively corresponding to the memory cells MC0 through MC31. A plurality of bit line pairs BLe0 and BLo0 to BLe(n-1) and BLo(n-1) may be arrayed to cross the word lines WL0 through WL31.

The flash memory device 100 according to the embodiment of FIG. 1 may simultaneously program all bit lines. That is, even bit lines BLe0 through BLe(n-1) and odd bit lines BLo0 through BLo(n-1) may be simultaneously programmed. Thus, a corresponding programming time may be significantly reduced over memory devices incapable of simultaneously programming all bit lines.

However, in order to ensure reliability of data, a read operation is performed on bit lines selected from each bit line pair BLe0 and BLo0 to BLe(n-1) and BLo(n-1). That is, even bit lines BLe0 through BLe(n-1) will be first sensed and then odd bit lines BLo0 through BLo(n-1) will be sensed. Thus, relative to the read operation each word line is read as two separate data pages.

Referring back to FIG. 1, a row decoder 110 is controlled by a control unit 150. The row decoder 110 selects one memory block MBLK in response to an address received by the control unit 150 from an input/output unit 140 and activates the rows of the selected memory block.

A column decoder and sensing unit 130 are also controlled by the control unit 150. When a read operation is being performed, the column decoder and sensing unit 130 transfer "read data" stored in a page buffer unit 120 to the input/output unit 140, or to the control unit 150 in response to an address provided from the input/output unit 140. For example, when a normal read operation is performed, the column decoder and sensing unit 130 transfer read data stored in the page buffer unit 120 to the input/output unit 140. On the other hand, when a verify read operation is performed, the column decoder and sensing unit 130 transfer read data stored in the page buffer unit 120 to the control unit 150. The control unit 150 then performs a verify operation to determine whether the read data received from the column decoder and sensing unit 130 has been correctly programmed. During a programming operation, the column decoder and sensing unit 130 transfer program data (or write data) received from the input/output unit 140 to the page buffer unit 120.

The page buffer unit 120, as controlled by the control unit 150, typically includes a plurality of page buffers PG0 through PGn-1 respectively connected to corresponding bit lines. A voltage generating unit 160, also controlled by the control unit 150, generates the respective voltages required for programming, read, verify, and erase operations within the flash memory device 100.

Referring to FIGS. 1 and 2, the memory cell array 170 of the flash memory device 100 is assumed to be implemented as a multi-level cell (MLC) flash memory device. More specifically, the flash memory device 100 is assumed to be a two-bit MLC flash memory device. A corresponding cell distribution is shown in FIG. 3. Those skilled in the art will recognize that three bit of higher MLC may be implemented in other embodiments of the invention, but a two-bit MLC flash memory device is used as an example.

Accordingly, each memory cell of the flash memory device 100 may be programmed into a state selected from a group of possible states including; an erase state E and three program states—first, second and third programs states P1, P2 and P3, respectively, as illustrated in FIG. 3. In particular, the states illustrated in FIG. 3 correspond to a case in which the erase state E, the first program state P1, the second program state P2, and the third program state P3 are respectively assigned data values of "11", "01", "10" and "00".

Once a memory cell has been programmed, the programmed data may subsequently be read in relation to a first read voltage VRD1, a second read voltage VRD2, and a third read voltage VRD3.

One of two bits programmed in the foregoing memory cell is designated as a most significant bit (MSB), and the other bit is designated as a least significant bit (LSB). Referring to FIG. 3, in the erase state E, the MSB is "1" and the LSB is "1". In the first program state P1, the MSB is "0" and the LSB is "1". In the second program state P2, the MSB is "1" and the LSB is "0", and in the third program state P3, the MSB is "0" and the LSB is "0".

For convenience of description, an operation programming the LSB will be referred to as "a LSB program", and an operation programming the MSB will be referred to as a "MSB program". In general, the LSB program is first performed followed by a corresponding MSB program.

As noted above, the flash memory device 100 of FIG. 1 may simultaneously program all bit lines. Thus, each memory block MBLK of the flash memory device 100 includes so-called normal cells NC for storing programmed data, and flag cells FC for storing a MSB flag that indicates whether or not a MSB program has been performed on memory cells of the particular page corresponding to the MSB flag.

As illustrated in FIG. 4, the MSB flag is set to a bit value "0" or "1". For example, in a case where the MSB program has been performed on the memory cells of the page corresponding to the MSB flag, the MSB flag is set (i.e., programmed) to a value of "0". At this time, a "0" state P for the MSB flag will have a distribution equal to that of the third program state P3 shown in FIG. 3.

On the other hand, in a case where the MSB program has not been performed, but only the LSB program has been performed on the memory cells of the page corresponding to the MSB flag, the MSB flag is set to a value of "1". At this time, a "1" state E for the MSB flag will have a distribution equal to that of the erase state E of FIG. 3.

As noted above, the flash memory device 100 of FIG. 1 may alternately read bit lines from each bit line pair during a read operation. For example, the even bit lines BLe0 through BLe(n−1) may be first read and then the odd bit lines BLo0 through BLo(n−1) may be read. For convenience of description, hereinafter, the former is referred to as "a first read" and the latter is referred to as "a second read".

FIGS. 5 and 6 are diagrams describing a LSB read method performed in the flash memory device 100 of FIG. 1. In particular, FIG. 5 is a diagram describing a first read with respect to the LSB, and FIG. 6 is a diagram describing a second read performed after the first read with respect to the LSB of FIG. 5.

Referring to FIGS. 1 and 5, the flash memory device 100 applies a second read voltage VRD2, which has a voltage value between a first program state P1 and a second program state P2, to the even bit lines BLe0 through BLe(n−1) (operation 1). At the same time, the bit value of an MSB flag is detected since the cell distribution of the MSB flag is the same as that of FIG. 4. By using the MSB flag, it may be possible to know whether the MSB program has been performed on the memory cells of the page corresponding to the MSB flag.

Here, the flash memory device 100 of FIG. 1 includes a flag storing unit 180 for storing the respective MSB flags. Referring to FIG. 1, the flag storing unit 180 exchanges the MSB flag with the column decoder and sensing unit 130 but one or more embodiments of the inventive concept are not limited thereto and thus, the flag storing unit 180 may be included in the column decoder and sensing unit 130 or in the page buffer unit 120. The flag storing unit 180 is controlled by the control unit 150.

Referring back to FIGS. 1 and 5, when the MSB flag is "0", that is, when the MSB program has been performed on the memory cells of the page corresponding to the MSB flag, as illustrated in FIG. 5A, and following operation 1, the value of the LSB is read. This sequence of steps ends the first read under the assumed conditions.

On the other hand, when the MSB flag is "1", that is, when the MSB program has not been performed but only the LSB program has been performed on the memory cells of the page corresponding to the MSB flag, as illustrated in FIG. 5B, an additional operation (operation 2) must be performed by applying to the corresponding word line the first read voltage VRD1 having a voltage value between the erase state E and the first program state P1.

When just the LSB program has been performed on the memory cells, the MSB flag has a cell distribution like that shown in FIG. 5B, so the LSB of each of the memory cell must be read by performing operation 2. Referring to FIG. 5B, the erase state E having a value of "1" has a cell distribution equal to that of the erase state E of FIG. 3, and a program state P having a value of "0" has a cell distribution extending over the first program state P1 and the second program state P2 of FIG. 3.

After the first read is performed on the even bit lines BLe0 through BLe(n−1) so as to read the LSB, as illustrated in FIG. 6, the second read is performed on the odd bit lines BLo0 through BLo(n−1) by using the MSB flag stored in the flag storing unit 180.

To be more specific, when the MSB flag read in the first read indicates that the MSB program has been performed on the memory cells of the page corresponding to the MSB flag, as illustrated in FIG. 6A, by applying only a second read voltage VRD2, which is a target voltage VTAG, to the corresponding word line (operation 1), it is possible to read the value of the LSB.

On the other hand, when the MSB flag read in the first read indicates that the LSB program has been performed on the memory cells of the page corresponding to the MSB flag, as illustrated in FIG. 6B, by applying only a first read voltage VRD1, which is the target voltage VTAG, to the corresponding word line (operation 1), it is possible to read the value of the LSB.

Figure 9:
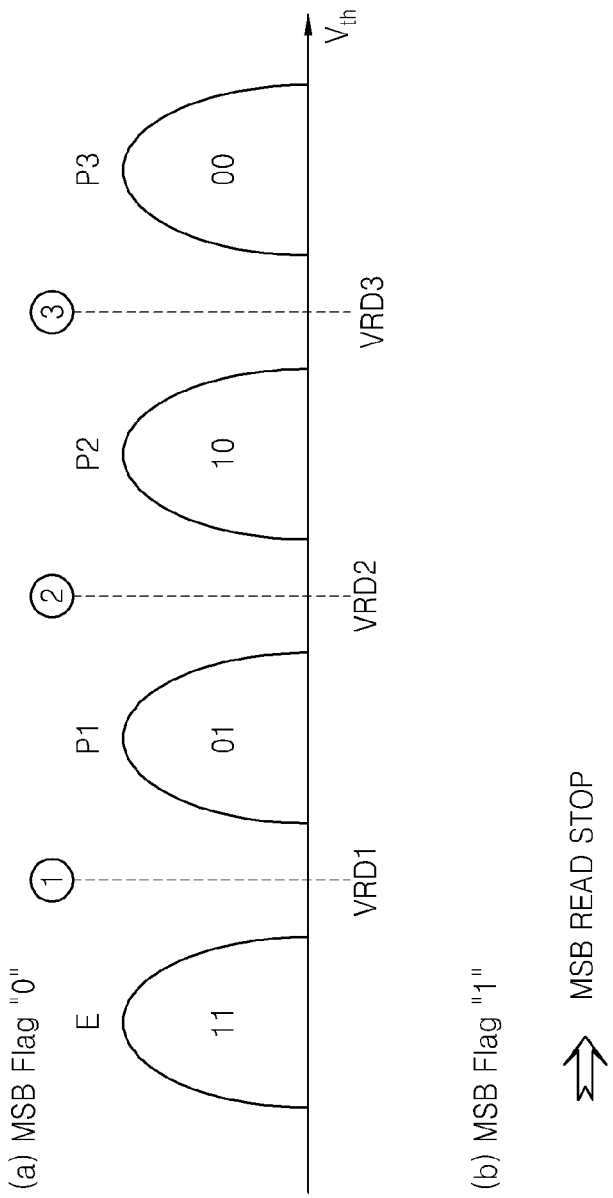
FIG. 9 is a diagram describing a second read following the first read with respect to either the MSB of FIG. 7 or FIG. 8.

FIGS. 7 through 9 are diagrams describing various MSB read methods performed in the flash memory device 100 of FIG. 1. In particular, FIGS. 7 and 8 are diagrams describing a first read with respect to the MSB, and FIG. 9 is a diagram describing a second read performed after the first read with respect to the MSB of one of FIGS. 7 and 8 is performed.

Referring to FIGS. 1 and 7, the flash memory device 100 first applies a second read voltage VRD2 to even bit lines BLe0 through BLe(n−1) (operation 1). As described above, the value of an MSB flag is detected by performing the operation 1.

When the MSB flag corresponds to FIG. 7B, the flash memory device 100 stores the MSB flag in the flag storing unit 180 and ends the first read. Since FIG. 7B corresponds to a case in which only an LSB program has been performed on a memory cell corresponding to the MSB flag, a read target MSB does not exist. At this time, the flash memory device 100 may reset the page buffer corresponding to the MSB flag.

On the other hand, FIG. 7A corresponds to a case in which an MSB program has been performed on the memory cell corresponding to the MSB flag. In this case, a first read voltage VRD1 and a third read voltage VRD3 may be sequentially applied to the even bit lines BLe0 through BLe(n−1) so that the MSB may be read.

However, the one or more embodiments of the inventive concept are not limited thereto, and thus, as illustrated in FIG. 8, the first read voltage VRD1 may be first applied to the even bit lines BLe0 through BLe(n−1) and then the second read voltage VRD2 may be applied thereto. At this time, when a value of an MSB flag is detected by the second read voltage VRD2 and when an MSB program is performed on a memory cell corresponding to the MSB flag as illustrated in FIG. 8A, the MSB of the corresponding memory cell may be read by applying the third read voltage VRD3.

On the other hand, FIG. 8B corresponds to a case in which the MSB program is not performed on the memory cell corresponding to the MSB flag, and in this case, an operation for reading the MSB may be discontinued. At this time, the flash memory device 100 may reset a page buffer corresponding to the MSB flag.

In this manner, after the first read is performed on the even bit lines BLe0 through BLe(n−1) so as to read the MSB, as illustrated in FIG. 8, by using the MSB flag that is stored in the flag storing unit 180 when the first read is performed, a second read is performed on the odd bit lines BLo0 through BLo(n−1).

Referring to FIG. 1 and a diagram of FIG. 9A, by using an MSB flag, the flash memory device 100 detects that an MSB program is performed on memory cells of a page corresponding to the MSB flag, and thus, sequentially applies a first read voltage VRD1 through a third read voltage VRD3 to odd bit lines BLo0 through BLo(n−1) (operations 1 through 3). However, the one or more embodiments of the inventive concept are not limited thereto and thus an order of applying the first read voltage VRD1 through the third read voltage VRD3 may be changed.

On the other hand, as illustrated in FIG. 9B, by using the MSB flag, the flash memory device 100 detects that the MSB program has not been performed on the memory cells of the page corresponding to the MSB flag and thus, may discontinue an operation for reading the MSB. At this time, the flash memory device 100 may reset a page buffer corresponding to the MSB flag.

In this manner, the flash memory device 100 according to an embodiment of the inventive concept may simultaneously program all bit lines and may minimize the time required to perform read operations, thereby improving performance of the flash memory device 100.

Figure 10:
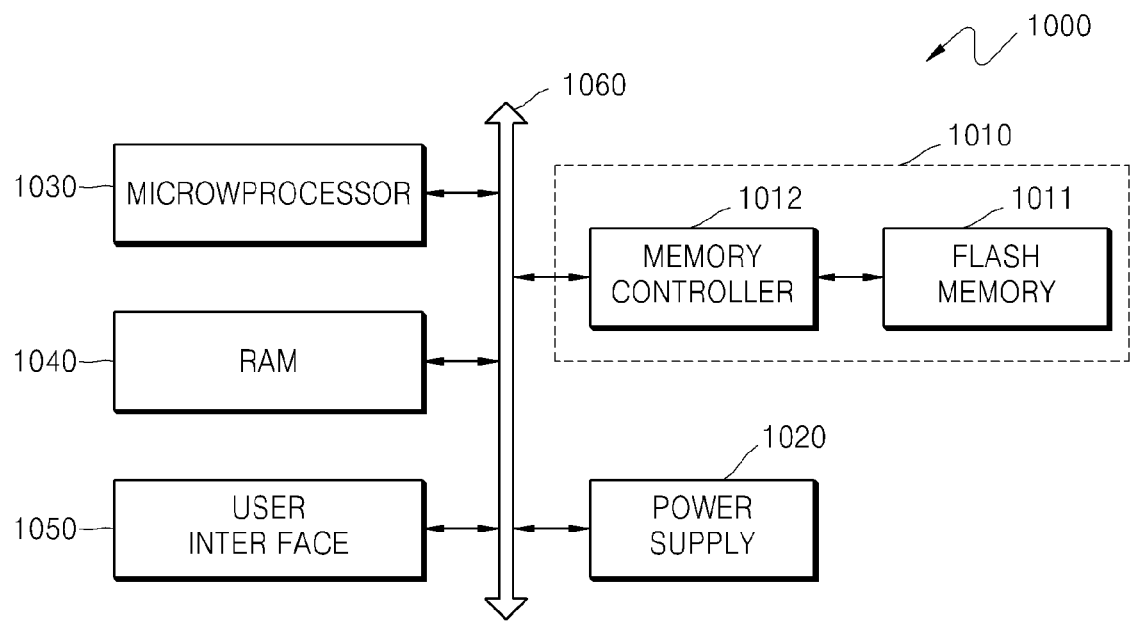
FIG. 10 is a block diagram of a computational system incorporating a flash memory device according to embodiment of the inventive concept.

FIG. 10 is a block diagram of a computational system 1000 incorporating a flash memory device 1011 according to an embodiment of the inventive concept.

Referring to FIG. 10, the computational system device 1000 comprises a microprocessor 1030 electrically connected to a bus 1060, a user interface 1050, a memory controller 1012, and a memory system device 1010 including the flash memory device 1011. The flash memory device 1011 may store N-bit data, where N is a positive integer greater than 1, via the memory controller 1012, wherein the N-bit data is processed by the microprocessor 1030. The computing system device 1000 may further include a random-access memory (RAM) 1040, and a power supplying unit 1020.

In the case where the computing system device 1000 is a mobile device, a modem such as a baseband chipset including a battery may be further provided to supply an operating voltage to a computing system. Also, it is well known to one of ordinary skill in the art that the computing system device 1000 may further include an application chipset, a camera image processor (CIS), a mobile dynamic random access memory (DRAM), and the like, and thus, detailed descriptions thereof will be omitted here.

The memory controller 1012 and the flash memory device 1011 may form a solid state drive/disk (SSD) that uses a non-volatile memory so as to store data.

Figure 11:
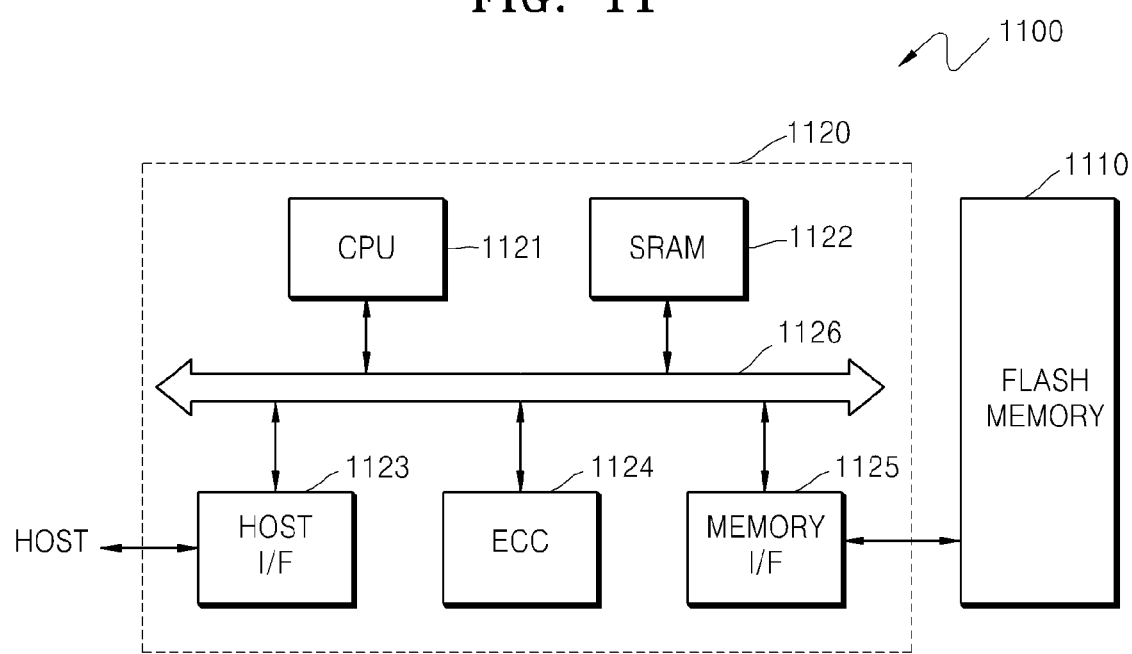
FIG. 11 is a block diagram of a memory card incorporating a flash memory device according to embodiment of the inventive concept.

As illustrated in FIG. 11, a flash memory device 1110 and a memory controller 1120 form a memory card 1100. In this case, the memory controller 1120 is formed to communicate with an external device (e.g., a host) via one of various interface protocols such as an Universal Serial Bus (USB), a Multi-Media Card (MMC), Peripheral Component Interconnect Express (PCI-E), Serial Advanced Technology Architecture (SATA), Parallel Advanced Technology Attachment (PATA), Small Computer System Interface (SCSI), Enhanced Small Disk Interface (ESDI), Integrated Drive Electronics (IDE), etc. Structures and operations with respect to a central processing unit (CPU) 1122, a static random access memory (SRAM) 1121, a host interface (I/F) 1123, an Error Correcting Code (ECC) 1124, a memory I/F 1125 and a bus 1126, which are included in the memory controller 1120 of FIG. 11, are well known to one of ordinary skill in the art, and thus, detailed descriptions thereof will be omitted here.

The flash memory device according to the one or more embodiments of the inventive concept may be implemented by using various forms of packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

In the above description, the two-bit MLC flash memory device and the method of reading the same are described. However, the embodiments of the inventive concept are not limited thereto and thus, may also be applied to three or more bits MLC flash memory devices and a method of reading the same.

While the inventive concept has been particularly shown and described with reference to exemplary embodiments thereof, it will be understood that various changes in form and details may be made therein without departing from the scope of the following claims.

What is claimed is:

1. A method of reading data a programmed in a multi-level cell (MLC) flash memory device, the method comprising:

reading a least significant bit (LSB) of the data; and
reading a most significant bit (MSB) of the data after the reading the LSB read;
wherein the reading the LSB comprises:
performing a first read with respect to a plurality of first bit lines; and
performing a second read with respect to a plurality of second bit lines after the first read;
wherein the performing the first read comprises:
applying a X read voltage to a word line;
identifying a MSB flag indicating whether or not the MSB for memory cells connected to the word line has been programmed as a result of the applying the X read voltage to the word line;
and
performing one of an identifying the LSB for the memory cells with a result of the applying the X read voltage to the word line and an additional applying a Y read voltage to the word line, in view of a value of the MSB flag.

2. The method of claim 1, wherein the identifying the MSB flag comprises:
storing the read value of the MSB flag in a flag storing unit separately configured from a memory cell array within the MLC flash memory device.

3. The method of claim 1, wherein the MLC flash memory device is an N-bit MLC flash memory device, where N is an integer greater than 2, and the performing the first read comprises reading the MSB flag using the X read voltage selected from a group of N-1 read voltages, each having different voltage levels and each adapted to read N bits of data stored in the memory cells of the N-bit MLC flash memory device.

4. The method of claim 1, wherein when the MSB flag indicates that the MSB has been programmed in the memory cells, the identifying the LSB for the memory cells is performed, and
When the MSB flag indicates that the MSB has not been programmed in the memory ells the additional applying the Y read voltage to the word line is performed.

5. The method of claim 1, wherein the MLC flash memory device is a 2-bit MLC flash memory device having a cell distribution for the plurality of memory cells including a first distribution, a second distribution, a third distribution and a fourth distribution, and data values of "11", "01", "10" and "00" are respectively assigned to the first distribution, second distribution, third distribution and fourth distribution, and
each a first value of the MSB flag indicates that the MSB has not been programmed in the memory cells and a second value of the MSB flag value indicates that the MSB has been programmed in the memory cells is corresponding to the first and the fourth distribution, respectively.

6. The method of claim 1, wherein the MLC flash memory device is a 2-bit MLC flash memory device having a cell distribution for the plurality of memory cells including a first distribution, a second distribution, a third distribution and a fourth distribution, and data values of "11", "01", "10" and "00" are respectively assigned to the first distribution, second distribution, third distribution and fourth distribution, and the X read voltage has a voltage level between the second distribution and the third distribution.

7. The method of claim 1, wherein the performing the second read comprises;
when the MSB flag indicates that the MSB has been programmed in the memory cells, applying the X read voltage to the word line; and
when the MSB flag indicates that the MSB has not been programmed in the memory cells, applying the Y read voltage to the word line.

8. The method of claim 1, wherein the reading the MSB comprises:
performing at least one of a third read with respect to a plurality of the first bit lines; and
performing at least one of a fourth read with respect to the plurality of second bit lines after the third read,
wherein the performing each of the at least one of third read and at least one of fourth read comprises;
when the MSB flag indicates that the MSB has been programmed in the memory cells, the performing each of the at least one of third read and at least one of fourth read is performed; and
when the MSB flag indicates that the MSB has not been programmed in the memory cells, the reading the MSB is stopped.

9. A method of reading data programmed in a 2-bit multi-level cell (MLC) flash memory device, the method comprising:
when the 2-bit MLC flash memory device having a cell distribution for the plurality of memory cells including a first distribution, a second distribution, a third distribution and a fourth distribution, and values of "11", "01", "10" and "00" of the data are respectively assigned to the first distribution, second distribution, third distribution and fourth distribution and identified by a first read voltage, a second read voltage and a third read voltage,
reading a least significant bit (LSB) of the data; and
reading a most significant bit (MSB) of the data after the reading the LSB read,
wherein the reading the LSB comprises:
applying the second read voltage to a word line;
identifying a MSB flag indicating whether or not the MSB for memory cells connected to the word line has been programmed as a result of the applying the second read voltage to the word line; and
controlling a voltage applied to the word line in view of a value of the MSB flag.

10. The method of claim 9, when the MSB flag indicates that the MSB has been programmed in the memory cells, wherein the controlling the voltage comprises not applying the voltage to the word line and identifying the LSB for the memory cells with a result of the applying the second read voltage to the word line.

11. The method of claim 10, wherein the reading the MSB comprises sequentially applying the first read voltage and third read voltage to the word line.

12. The method of claim 9, when the MSB flag indicates that the MSB has not been programmed in the memory cells, wherein the controlling the voltage comprises applying a LSB read voltage by which identifies between a erase distribution and a program distribution of a LSB program.

13. The method of claim 10, wherein the reading the MSB comprises stopping the reading the MSB.

14. The method of claim 9, wherein the reading the LSB comprises:
performing a first read with respect to a plurality of first bit lines by the applying the second read voltage, the identifying the MSB flag and the controlling the voltage; and
performing a second read with respect to a plurality of second bit lines after the first read by the controlling the voltage in view of a value of the MSB flag identified by the performing the first read.

15. The method of claim 9, wherein the reading the MSB comprises:
 performing at least one of a third read with respect to a plurality of the first bit lines; and
 performing at least one of a fourth read with respect to the plurality of second bit lines after the third read.

\* \* \* \* \*